United States Patent
Sugawara et al.

(10) Patent No.: US 9,070,532 B2
(45) Date of Patent: Jun. 30, 2015

(54) CHARGED PARTICLE BEAM APPARATUS SAMPLE HOLDER WITH MAGNETIC FIELD GENERATING ELEMENT AND SAMPLE HOLDING ELEMENT

(71) Applicant: Hitachi, Ltd., Chiyoda-ku, Tokyo (JP)

(72) Inventors: Akira Sugawara, Tokyo (JP);
Tomokazu Shimakura, Tokyo (JP);
Yoshio Takahashi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/260,452

(22) Filed: Apr. 24, 2014

(65) Prior Publication Data

US 2014/0319371 A1    Oct. 30, 2014

(30) Foreign Application Priority Data

Apr. 25, 2013    (JP) ................. 2013-092436

(51) Int. Cl.
*G21K 5/10*    (2006.01)
*H01J 37/20*   (2006.01)
*H01J 37/26*   (2006.01)
*H01J 37/09*   (2006.01)

(52) U.S. Cl.
CPC .............. *H01J 37/20* (2013.01); *H01J 37/266* (2013.01); *H01J 37/09* (2013.01); *H01J 2237/2008* (2013.01); *H01J 2237/0264* (2013.01)

(58) Field of Classification Search
CPC .......... H01J 37/00; H01J 37/02; H01J 37/18; H01J 37/32715; H01J 37/3435; H01J 2237/28; H01J 2237/2801; H01J 2237/2802; G01N 1/06; G01N 1/28

USPC ................ 250/306, 307, 440.11, 442.11
See application file for complete search history.

(56) References Cited

U.S. PATENT DOCUMENTS

| | | | |
|---|---|---|---|
| 4,596,934 A * | 6/1986 | Yanaka et al. | 250/442.11 |
| 6,531,698 B1 * | 3/2003 | Benner | 250/311 |
| 6,838,675 B2 | 1/2005 | Harada et al. | |
| 8,653,472 B2 | 2/2014 | Harada et al. | |
| 2001/0019411 A1 * | 9/2001 | Nara et al. | 356/394 |

FOREIGN PATENT DOCUMENTS

| | | |
|---|---|---|
| JP | 08-264146 | 10/1996 |
| JP | 2002-296333 | 10/2002 |
| JP | 2007-080724 | 3/2007 |
| JP | 2011-076812 | 4/2011 |
| JP | 2012-129137 | 7/2012 |

* cited by examiner

*Primary Examiner* — Jack Berman
*Assistant Examiner* — Jason McCormack
(74) *Attorney, Agent, or Firm* — Miles & Stockbridge P.C.

(57) ABSTRACT

The disclosed invention provides a sample holder capable of reducing or preventing the influence of a charged particle beam deflected by applying a magnetic field to a sample and provided with means for simply switching between a mode of observing a sample while applying a magnetic field to the sample, and a mode free of a magnetic field in which a magnetic field becomes zero completely. The sample holder includes a magnetic field generating element including three or more magnetic gaps for applying a magnetic field to a sample, a cantilever-beam-shaped sample holding element that holds a sample on one end thereof, and a moving mechanism that adjusts a relative position between a sample and a magnetic gap. The magnetic gaps can be placed along an optical axis of a charged particle beam.

13 Claims, 9 Drawing Sheets

CHARGED PARTICLE BEAM APPARATUS SAMPLE HOLDER WITH MAGNETIC FIELD GENERATING ELEMENT AND SAMPLE HOLDING ELEMENT

CLAIM OF PRIORITY

The present application claims priority from Japanese patent application JP2013-092436 filed on Apr. 25, 2013, the content of which is hereby incorporated by reference into this application.

BACKGROUND OF THE INVENTION

1. Field of the Invention

The present invention relates to a sample holder and a charged particle beam apparatus using the same, suitable for applying a magnetic field to a sample to be observed or worked.

2. Description of the Related Art

When an electron beam passes through a magnetic material sample placed in an electron microscope, electrons are deflected by Lorentz force caused by magnetic fluxes inside the sample. By Lorentz electron microscopy and electron beam holography which apply this principle, it is possible to observe magnetic domain structures inside a sample. This method is most effective in investigating the magnetic response of an in-plane component of magnetization of a sample upon applying a magnetic field to the sample along an in-plane direction.

By incorporating a magnetic field application element provided with a magnetic circuit including a magnetic core made of a soft magnetic material and a coil for magnetic field application into a sample holding device, an "in-situ" observation of a change in-plane magnetic domain structure of a sample is performed during application of a magnetic field perpendicular to an optical axis. Samples for electron microscopes generally have an external form like the shape of a disc with a diameter of 3 mm. While it is possible to accurately position a sample inside a magnetic gap that is larger than the sample diameter and apply a magnetic field along a direction parallel to the plane of the sample, a maximum magnetic field is not more than several tens of oersteds in most cases. Accordingly, in order to increase a magnetic field applied, it is practiced to bring the surface of a sample in contact with the top and under side surfaces of a pair of magnetic poles having a magnetic gap whose width is narrower than the size of a sample (Japanese Published Unexamined Patent Application Nos. Hei 8-264146 and 2007-80724). In this case, however, because of making use of a magnetic field that leaks from the magnetic gap into free space, the magnetic field applied to the sample does not become completely parallel to the surface of the sample and has a component in a direction perpendicular to the surface of the sample. Because the point where the magnetic field is produced is quite far from the center of the magnetic gap, there is a disadvantage that the applied magnetic field is subject to a large spatial variation. Another disadvantage of this method is that the magnetic field does not become zero even if conduction current is zeroed because of remnant magnetization of the magnetic material and it is difficult to observe the state of the sample in a condition where there is no magnetic field.

Even in a case where this method is used, a maximum applied magnetic field is not more than about 200 oersteds. This is because this mechanism makes it difficult to accurately position a sample to be aligned with the magnetic gap and, accordingly, the magnetic gap remains on the order of 1 mm.

There is also an omni-directional type magnetic field application device including a set of superconductive electromagnets installed within a main body so as to surround a sample holding device (Japanese Published Unexamined Patent Application No. 2002-296333). Because of using superconductive coils of an air core type, this magnetic field application device is capable of putting remnant magnetization to zero, but a maximum magnetic field is not more than about 200 oersteds. The magnetic field application device having a five-tier structure and provided with a mechanism for correcting the deflection of an electron beam caused by a magnetic field has a disadvantage that its shape becomes too large.

SUMMARY OF THE INVENTION

In the light of the background art discussed above, the present inventors have further examined matters that are likely to be a problem encountered in the working or observation of a magnetic material sample in future and thought that countermeasures are needed to address, particularly, among others, the following disadvantages: charged particles such as electrons are considerably deflected when a large magnetic field of several kilooersteds is applied to a sample; and it is impossible to switch between a state of application of a magnetic field to a sample and no magnetic field state.

In view of the foregoing problems, an object of the present invention is to provide a sample holder and a charged particle beam apparatus using the same, capable of reducing or preventing the influence of a charged particle beam deflected by applying a magnetic field to a sample and provided with a means for simply switching between a mode of observing a sample while applying a magnetic field to the sample, and a mode free of a magnetic field, in which a magnetic field becomes zero completely.

To achieve the foregoing object, one aspect of the present invention resides in a sample holder including:

a magnetic field generating element including three or more magnetic circuits, each having a magnetic gap for applying a magnetic field to a sample;

a cantilever-beam-shaped sample holding element that holds the sample on one end thereof;

a moving mechanism that adjusts a relative position between the sample and the magnetic gap within a range of the magnetic gap; and a frame element that defines an outside structure of the sample holder.

It is featured that the magnetic gap can be placed along an optical axis of a charged particle beam.

Another aspect of the present invention resides in a charged particle beam apparatus including:

an irradiation optical system that irradiates a sample with a charged particle beam;

a magnetic field generating element including three or more magnetic circuits, each having a magnetic gap for applying a magnetic field to the sample;

a cantilever-beam-shaped sample holding element that holds the sample on one end thereof; and a moving mechanism that adjusts a relative position between the sample and the magnetic gap within a range of the magnetic gap.

It is possible to provide a sample holder and a charged particle beam apparatus using the same, capable of reducing or preventing the influence of a charged particle beam deflected by applying a magnetic field to a sample and provided with means for simply switching between a mode of observing a sample while applying a magnetic field to the sample, and a mode free of a magnetic field in which a magnetic field becomes zero completely.

DETAILED DESCRIPTION OF THE INVENTION

In order to provide means for simply switching between a mode of observing a sample positioned in the center of a magnetic gap while applying a large magnetic field of several kilooersteds, which is perpendicular to an optical axis of a charged particle beam apparatus, to the sample, and a mode free of a magnetic field in which a magnetic field becomes zero completely, a holder for magnetic field application is contrived, provided with a function of positioning a sample fixed to the tip of a cantilever-beam-shaped sample holding element in the center of one of magnetic gaps having a small gap width and a small thickness, formed in a magnetic field application element (magnetic yokes), using a moving mechanism. Also, the holder for magnetic field application is contrived in which it is possible to easily switch between the magnetic field application and observation mode and the mode free of a magnetic field by a movable and integral magnetic field application mechanism provided with a plurality of tiers of the magnetic yokes. In order to apply a large magnetic field of several kilooersteds to a sample, herein, the sample is worked to desired dimensions so as to fit in a magnetic yoke gap and used. This enables making exciting coils smaller and reducing a conduction current.

By positioning a sample inside one of the magnetic gaps having a small thickness and a small gap width, it is possible to apply a large magnetic field to the sample along an in-plane direction and reduce the amount of deflection of an electron beam. The integral magnetic field application mechanism including multiple tiers of magnetic yokes is movable by the moving mechanism. This can change a relative positional relation between the magnetic field application element and the sample and enables the apparatus to function in a plurality of modes.

In the following, the invention will be described by way of embodiments and using the drawings.

First Embodiment

Figure 8:
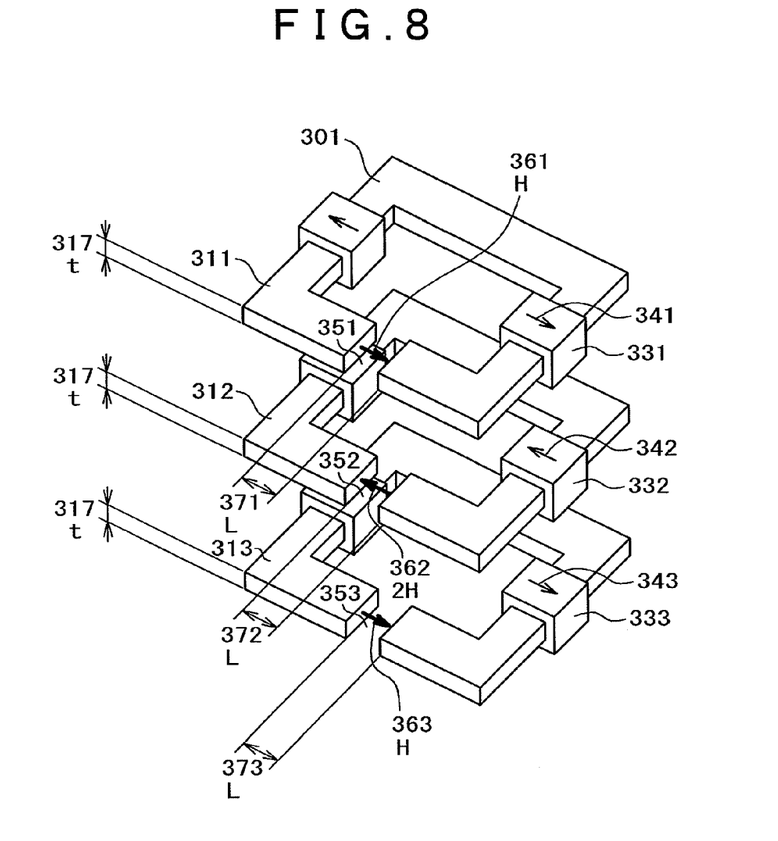
FIG. 8 is a perspective view of a basic structure of three-tier magnetic pole elements in the sample holder pertaining to the first embodiment of the present invention.

A first embodiment of the present invention is described using FIGS. 1 through 5, 8, and 9. FIG. 8 depicts a perspective view of a basic structure of a magnetic field application element 301 having three-tier magnetic gaps 351 to 353 in a sample holder pertaining to the first embodiment. A first tier of the magnetic field application element includes a magnetic yoke 311 with a magnetic gap 351 and windings 331; a second tier thereof includes a magnetic yoke 312 with a magnetic gap 352 and windings 332; and a third tier thereof includes a magnetic yoke 313 with a magnetic gap 353 and windings 333, respectively. By allowing currents 341, 342, 343 to flow through the windings (coils) on each tier respectively, magnetic fields 361, 362, 363 are produced in the magnetic gaps 351, 352, 353 on each tier. Although the magnetic field application element 301 has three tiers in the present embodiment, it may have more tiers. In FIG. 8, a reference numeral 317 denotes thickness t of a magnetic pole element; reference numeral 371 denotes length L of a magnetic gap on the first tier; reference numeral 372 denotes length L of a magnetic gap on the second tier; and reference numeral 373 denotes length L of a magnetic gap on the third tier. Note that the same reference numerals denote the same components throughout all drawings. In the present embodiment, descriptions are provided for a case where electron beams are used, which are also applicable in a case where ion beams are used.

Figure 1:
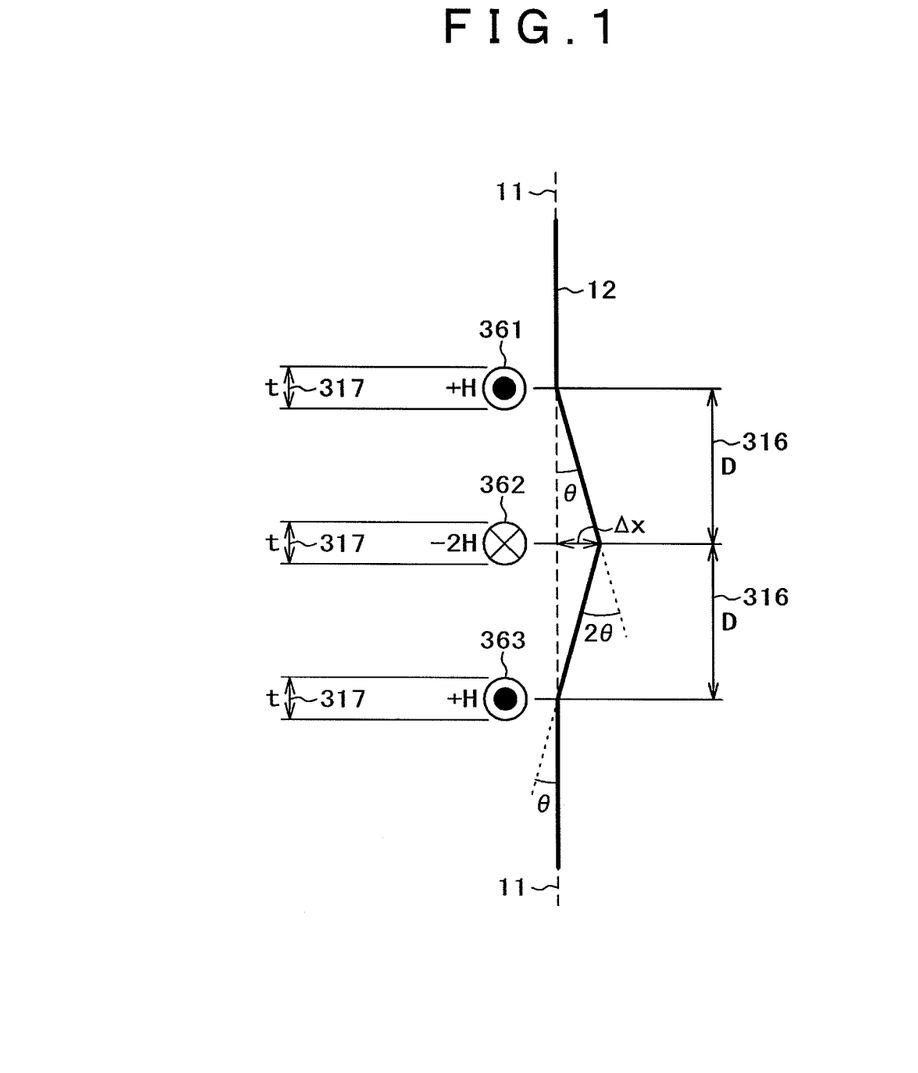
FIG. 1 is a cross-sectional view of a principal section of a sample holder pertaining to a first embodiment of the present invention, which illustrates three-tier magnetic field application that deflects an electron beam and returns it back to its course, particularly depicting an electron beam trajectory and an angle of deflection.

FIG. 1 is a cross-sectional view of a principal section of the sample holder pertaining to the present embodiment, which illustrates three-tier magnetic field application that deflects an electron beam and returns it back to its course, particularly depicting an electron beam trajectory and an angle of deflection. Through the use of FIG. 1, an explanation is provided about the electron beam trajectory when the electron beam passes through the three-tier magnetic yoke gaps 351 to 353. By applying a magnetic field H in a forward direction to the first and third tiers and applying a magnetic field in a reverse direction, multiplied by two times the magnetic field H, to the intermediate tier, an electron beam trajectory 12 is deflected, as it passes through the three tiers for deflection, and returns to an optical axis 11 of an electron beam apparatus when exiting the three tiers. The magnetic fields 361 to 363 that are generated by the magnetic yoke gaps 351 to 353 are proportional to a conduction current I and the number of coil windings N and inversely proportional to the lengths 371 to 373 (L) of the magnetic gaps, as expressed in Equation (1). By forming the magnetic gaps having extremely narrow lengths 371 to 373 and positioning a sample in the center of one of the gaps, it is possible to apply a large magnetic field on the order of kilooersteds to the sample. An advantage of this arrangement is that, when the strength of the magnetic field 361 has been changed, the electron beam trajectory 12 is displaced from a sample 201 to only a small degree. This small displacement can easily be corrected by coils for modifying the direction of the electron beam in the main body of the electron beam apparatus. The deflection of the electron beam takes place only inside the magnetic gaps and the beam follows a straight line trajectory between each tier. Equation (2) expresses that the angle of deflection θ is proportional to the product of magnetic field strength H and the length of an electron range within the magnetic field. The angle of deflection θ inside a gap is proportional to the thickness 317 (t) of a magnetic pole element, as expressed in Equation (2). Thus, an increase in the angle of deflection θ can be suppressed by reducing the thickness of a magnetic pole element, even if the strength of the magnetic fields 361 to 363 is large.

[Equation 1]

$$H = 0.4\pi \cdot N \cdot I/L \quad (1)$$

[Equation 2]

$$\theta = \mu_0 H \cdot t \sqrt{\frac{q}{2mV_0}} \quad (2)$$

The displacement (distance) Δx of the electron beam trajectory when the electron beam has come at the second-tier magnetic yoke gap 352 takes place when electrons are traveling deflected by the angle of deflection θ in space that is free of a magnetic field between magnetic pole elements; the displacement (distance) Δx can be represented approximately in Equation (3), where a distance between tiers is denoted by D. Equation (3) expresses that the displacement distance Δx of the electron beam trajectory from the optical axis is proportional to the product of the angle of deflection θ and the distance between tiers D.

[Equation 3]

$$\Delta x = D \cdot \theta \quad (3)$$

Figure 2:
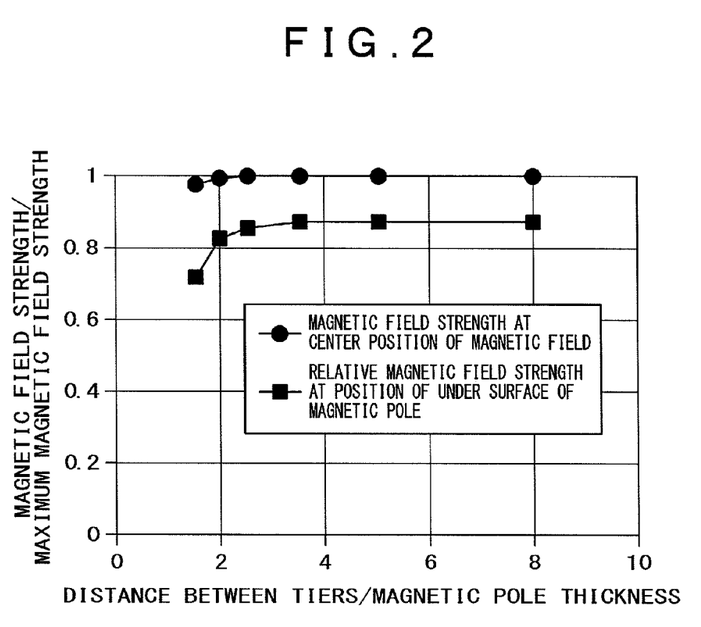
FIG. 2 is a graph representing magnetic field strength as a function of a ratio of distance between tiers/magnetic pole thickness.

Therefore, in a case where magnetic field space is designed to be small as in the present embodiment, there is a possibility that the electron beam trajectory deviates from the magnetic field space, and it is thus important to decrease the distance between tiers 316 (D) so that the displacement of the electron beam from the optical axis can be suppressed to be small. On the other hand, if the distance between tiers 316 is made too small, there is a possibility that that the maximum strength of a magnetic field produced in a magnetic gap is reduced by the influence of a reverse magnetic field produced on an adjacent tier or the uniformity of the magnetic fields in the magnetic yoke gaps 351 to 315 is lost. FIG. 2 is a graph representing magnetic field strength as a function of a ratio of distance between tiers/magnetic pole thickness. As can be seen from the graph, when the ratio of distance between tiers/magnetic pole thickness becomes less than 3, there is a significant decrease in the magnetic field strength at a point where the optical axis intersects the position of the top surface (under surface) of a magnetic pole. This means that it becomes hard to position a sample inside a gap where a magnetic field gradient is small, though doing so is beneficial. Hence, it is preferable to make a configuration such that the ratio of distance between tiers/magnetic pole thickness will be not less than 3.

Figure 3:
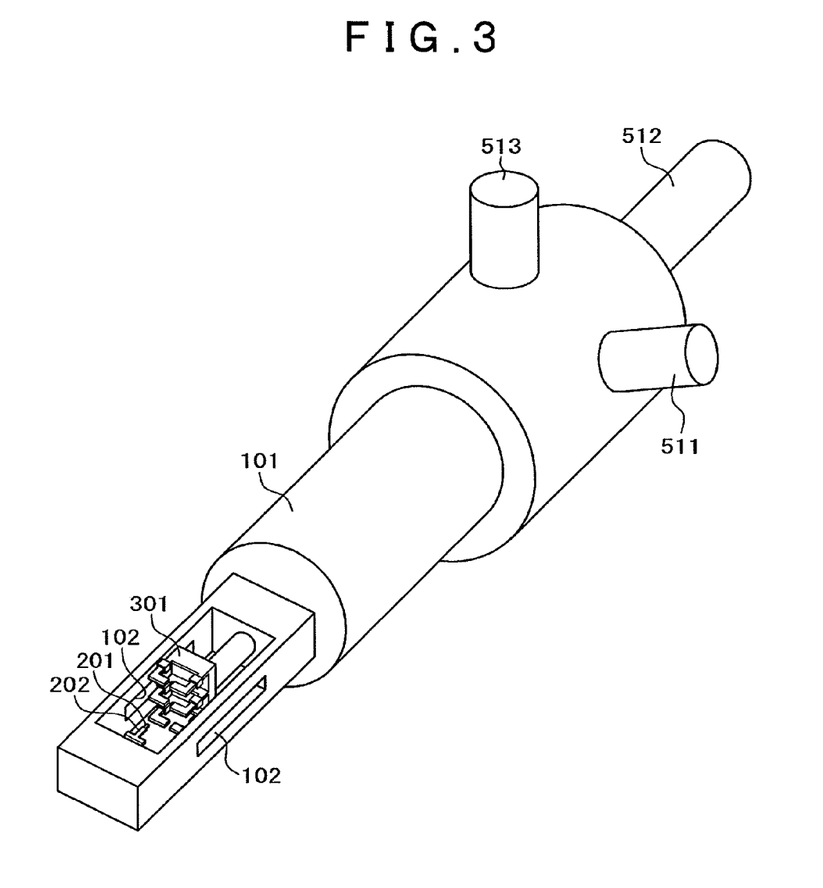
FIG. 3 is a schematic overall perspective view of the sample holder pertaining to the first embodiment of the present invention, which depicts a positional relation among a frame element, a sample, a magnetic field application element, and a moving mechanism.
Figure 4:
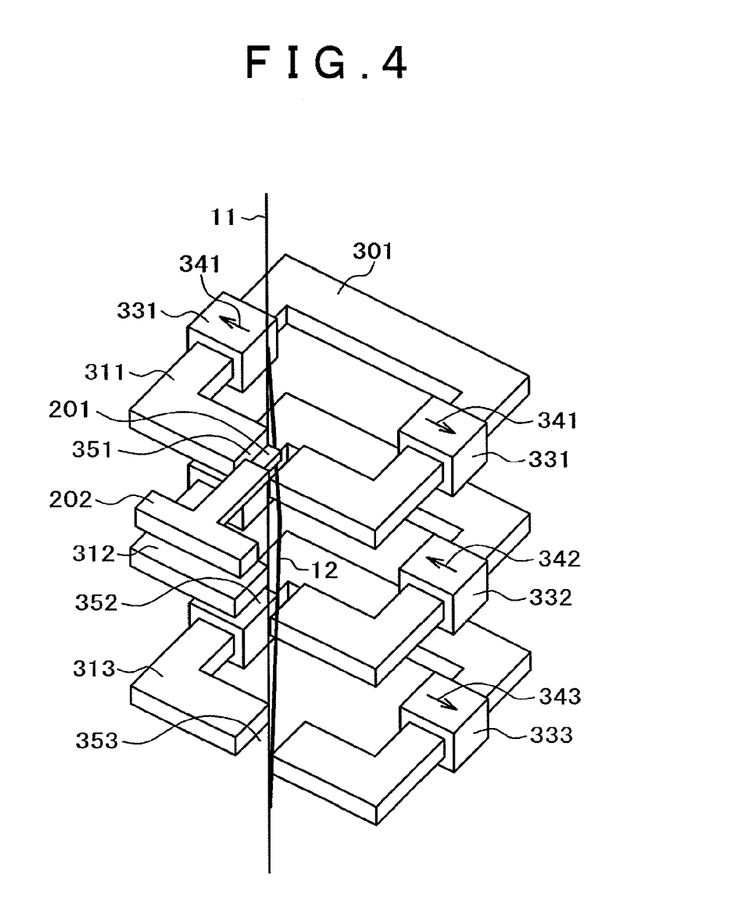
FIG. 4 is a perspective view of the principal section of the sample holder pertaining to the first embodiment of the present invention in a case where a sample is positioned inside a gap on a first tier.

FIG. 3 depicts the disposition of a sample holder frame 101, holder slots 102, the sample 201, a cantilevered beam shaped sample supporting element (holding element) 202, the magnetic field application element 301, and magnetic field application element moving mechanisms 511 to 513. In the present embodiment, the sample 201 is positioned in the center of the magnetic yoke gap 351 on the first tier at the most upstream position with respect to an electron beam flow 12, as depicted in FIG. 4. The sample 201 fixed to the tip of the cantilevered beam shaped sample supporting element 202 is fixed to a frame element 101. The magnetic field generating element (magnetic field application element) 301 including the magnetic yokes 311 to 313 with exciting coils 331 to 333 wound thereon, respectively having the magnetic gaps, is moved by the moving mechanism 511 to 513 so as to approach the sample and setting is performed so that the sample 201 to be observed is positioned in the center of the magnetic yoke gap 351 on the first tier. While it is convenient to make a rough adjustment under a stereoscopic microscope outside an electron microscope, the slots 102 made in the frame element 101 can make it easy to see a three-dimensional positional relation between the sample 201 and the magnetic yoke gap 351 on the first tier.

Figure 9:
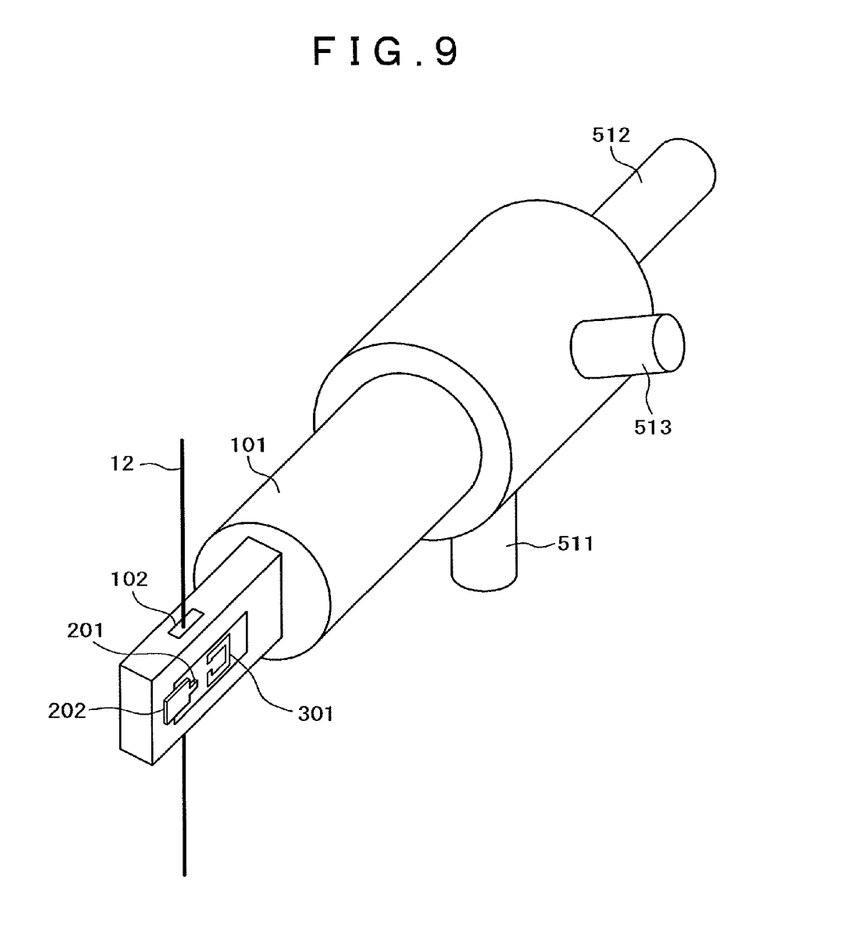
FIG. 9 is schematic overall perspective view depicting a positional relation among an electron beam, a sample, and magnetic pole elements when the sample holder depicted in FIG. 3 is tiled by 90 degrees.

The sample holder in which the sample 201 has been set is put into the electron beam apparatus 10 and irradiated with an electron beam. While viewing an electron microscopic image thus obtained, the positional relation between the sample 201 and the magnetic yoke gap 351 is adjusted by the moving mechanism 511 to 513. As depicted in FIG. 9, when the sample holder is rotated by 90 degrees in the electron microscope, the electron beam 12 passes through the slots 102 made on both sides of the holder. Likewise, while viewing an electron microscopic image, the positional relation between the sample 201 and the magnetic yoke gap 351 can be adjusted by the moving mechanism 511 to 513.

Figure 5:
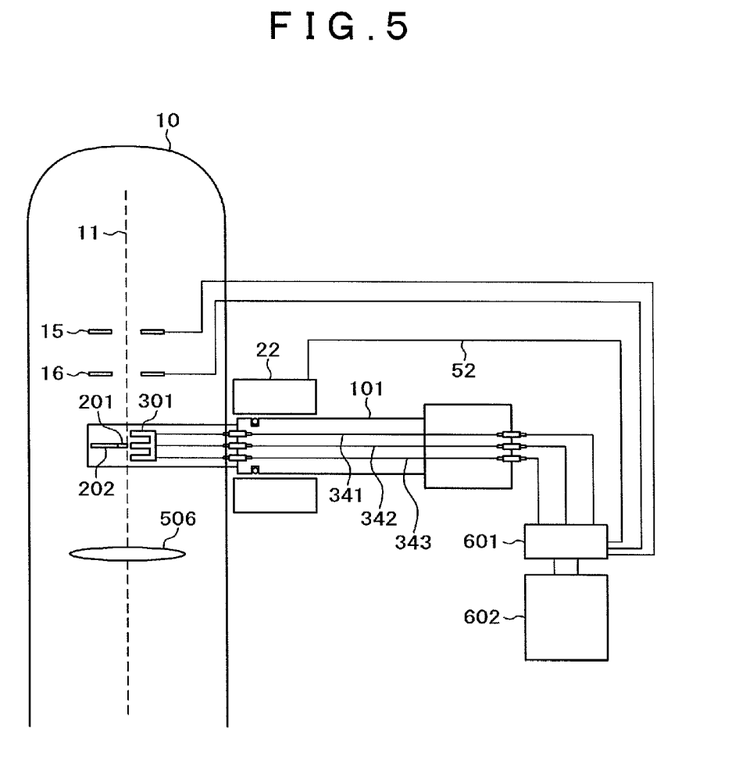
FIG. 5 is a schematic diagram of a mechanism that coordinately controls conduction currents for coils, deflecting coils in the main body of an electron beam apparatus, and a sample position in a charged particle beam apparatus pertaining to the first embodiment of the present invention.

As depicted in FIG. 5, it is also effective to install an information processing unit 601 that coordinately changes the conduction currents 341 to 343 for the coil windings on the respective tiers and the conduction currents for electron beam deflecting coils 15, 16 in the main body of the electron beam apparatus 10.

It is preferable that the magnetic yokes 311 to 313 on the respective tiers are made of a material such as 80-20 permalloy or 50-50 permalloy which is a soft magnetic material with a property in which remnant magnetization is extremely small and saturated magnetization is large.

If the magnetic yokes 311 to 313 on the respective tiers are each formed of a plurality of members, an assembly clearance that is made, accompanied by jointing the members, also functions as a magnetic gap, which thus results in a decrease in the strength of the magnetic fields produced in the magnetic gaps 351 to 353 arranged along the optical axis. Therefore, it is preferable that each of the magnetic yokes 311 to 313 on the respective tiers is formed of a monolithic member. It is preferable that each yoke is a monolithic part except for its magnetic gap.

A large magnetic field can be obtained by making the magnetic yokes 311 to 313 on the respective tiers have a narrow magnetic gap length 371 to 373 of 500 μm or less. However, high assembly precision is required in order to arrange the magnetic yoke gaps 351 to 353 having such a small length along the optical axis 11.

Difficulty as mentioned above can be avoided by machining the magnetic yokes 311 to 313 as an integral structure member. To create narrow magnetic yoke gaps 351 to 353 along the optical axis 11, it is effective to perform wire cut machining using an extra fine wire or use an electric discharge machining device among others.

The sample holder depicted in FIG. 3 is mounted in the charged particle beam apparatus depicted in FIG. 5 and a magnetic material sample is observed. Then, a good result has been obtained successfully.

According to the present embodiment as described above, it is possible to provide a sample holder and a charged particle beam apparatus using the same, capable of reducing or preventing the influence of a charged particle beam deflected by applying a magnetic field to a sample and provided with means for simply switching between a mode of observing a sample while applying a magnetic field to the sample, and a mode free of a magnetic field in which a magnetic field becomes zero completely. In addition, by working a sample to be smaller than a magnetic yoke gap (e.g., 500 μm or less), it is possible to apply a large magnetic field to the sample without causing a large current to flow using a large exciting coil.

Second Embodiment

Figure 6:
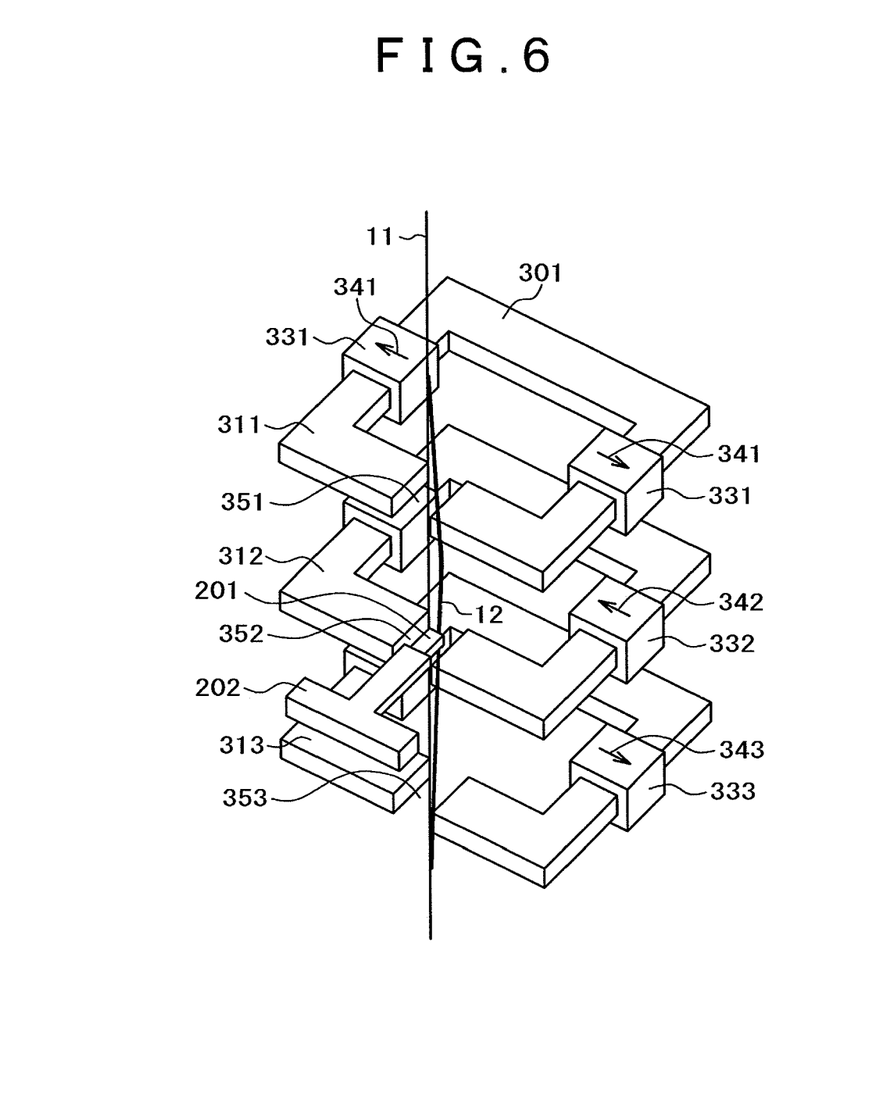
FIG. 6 is a perspective view of a principal section of a sample holder pertaining to a second embodiment of the present invention in a case where a sample is positioned inside a gap on a second tier and a maximum magnetic field is applied.

A second embodiment is described using FIG. 6. Note that the matters described in the first embodiment section, but not described in this section, can also be applied to this embodiment unless there are special circumstances.

In the present embodiment, a sample is positioned in the center of the magnetic yoke gap 352 on an intermediate tier which is the second one from the most upstream position with respect to the electron beam flow, as depicted in FIG. 6. Rough adjustment in air and positioning in the electron microscope can be performed in the same way as described in the first embodiment section.

An advantage of positioning the sample as above is that it is possible to apply, to the sample, a magnetic field that is twice as much as the magnetic field in the case of the first embodiment. However, when the strength of the magnetic fields 361 to 363 has been changed, a large displacement of the electron beam trajectory 12 from the sample 201 may take place and it is thus necessary to move the sample to trace the magnetic fields.

Alternatively, as depicted in FIG. 5, it is also effective to install an information processing unit 601 and a current control unit 602 that coordinately control the conduction currents 341 to 343 for the coil windings on the respective tiers, the conduction currents for electron beam deflecting coils 15 in the main body of the electron beam apparatus 10, and a sample moving mechanism 22 in the main body of the charged particle beam apparatus. A reference numeral 52 denotes a control signal line for the sample moving mechanism and a reference numeral 506 denotes an objective lens.

The sample holder depicted in FIG. 6 is mounted in the charged particle beam apparatus depicted in FIG. 5 and a magnetic material sample is observed. Then, a good result has been obtained successfully.

According to the present embodiment as described above, it is possible to provide a sample holder and a charged particle beam apparatus using the same, capable of reducing or preventing the influence of a charged particle beam deflected by applying a magnetic field to a sample and provided with means for simply switching between a mode of observing a sample while applying a magnetic field to the sample, and a mode free of a magnetic field in which a magnetic field becomes zero completely. In addition, by positioning a sample on the intermediate tier, it is possible to augment the strength of the magnetic field applied.

Third Embodiment

Figure 7:
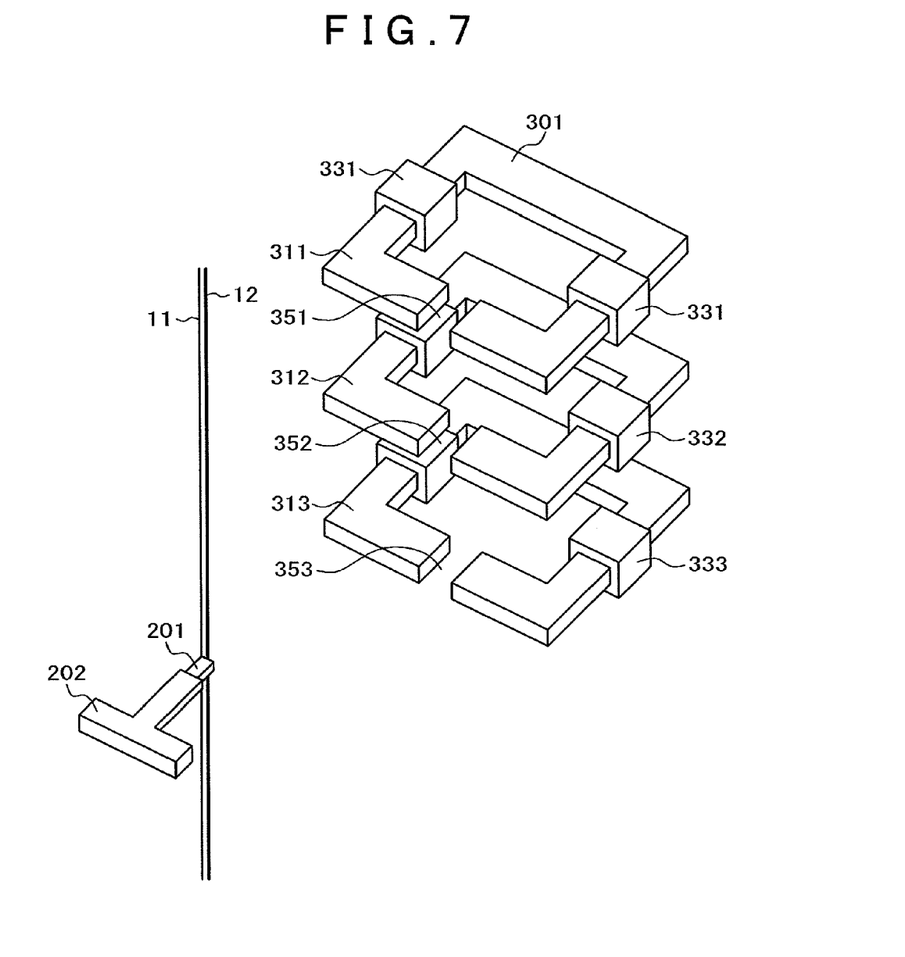
FIG. 7 is a perspective view of the principal section of the sample holder pertaining to the second embodiment of the present invention in a case where a sample and the magnetic field application element are positioned away from each other.

A third embodiment is described using FIG. 7. Note that the matters described in the first or second embodiment section, but not described in this section, can also be applied to this embodiment unless there are special circumstances.

In the present embodiment, the magnetic field in the position of a sample is put to zero by moving the magnetic field application element to a position quite far from the optical axis by the moving mechanism, as depicted in FIG. 7. Even if the conduction currents 341 to 343 are put to zero, the magnetic fields in the gaps 351 to 353 have a finite value which is not zero, because of remnant magnetization of the magnetic yokes 311 to 313. Hence, to realize a zero magnetic state of a sample, it is effective to move the magnetic field application element 301 physically away from the sample by the magnetic field application element moving mechanism 513. An advantage of the present embodiment is that it is possible to place the sample in a condition that is completely free of a magnetic field.

The sample holder depicted in FIG. 7 is mounted in the charged particle beam apparatus depicted in FIG. 5 and a magnetic material sample is observed. Then, a good result has been obtained successfully.

According to the present embodiment as described above, it is possible to provide a sample holder and a charged particle beam apparatus using the same, capable of reducing or preventing the influence of a charged particle beam deflected by applying a magnetic field to a sample and provided with means for simply switching between a mode of observing a sample while applying a magnetic field to the sample, and a mode free of a magnetic field in which a magnetic field becomes zero completely.

The present invention is not limited to the foregoing embodiments and various modifications are included therein. For example, the foregoing embodiments are those described in detail to explain the present invention clearly and the invention is not necessarily limited to those including all components described. A part of the configuration of an embodiment can be replaced by the configuration of another embodiment. To the configuration of an embodiment, the configuration of another embodiment can be added. As for a part of the configuration of each embodiment, another configuration can be added to it, it can be removed, or it can be replaced by another configuration.

What is claimed is:

1. A sample holder comprising:
   a magnetic field generating element including three or more magnetic circuits, each having a magnetic gap for applying a respective magnetic field to a sample;
   a cantilever-beam-shaped sample holding element that holds the sample on one end thereof;
   a moving mechanism that moves the magnetic field generating element to adjust a relative position between the sample and the magnetic gaps and;
   a frame element that defines an outside structure of the sample holder and supports the cantilever-beam-shaped sample holding element and the moving mechanism,
   wherein each magnetic circuit is configured such that the magnetic field formed by each magnetic gap can be perpendicular to an optical axis of a charged particle beam.

2. A charged particle beam apparatus using the sample holder according to claim 1, wherein the magnetic circuits are formed in an integral structure in which the magnetic circuits are spaced from each other by a distance between tiers that is three times or more as much as a thickness of a magnetic pole element.

3. A charged particle beam apparatus using the sample holder according to claim 1, further comprising an information processing unit,
wherein the moving mechanism moves the magnetic field generating element to a position where the sample is located inside any one of the magnetic gaps, which are three or more in number, and
wherein the information processing unit changes an observation mode based on the position.

4. The charged particle beam apparatus according to claim 3,
wherein the information processing unit causes the moving mechanism to move the magnetic field generating element to position the sample outside the magnetic gaps and changes the observation mode based on a fact that the sample is positioned outside the magnetic gaps.

5. A charged particle beam apparatus using the sample holder according to claim 1,
wherein two or more of the three or more magnetic circuits are magnetic circuits for deflecting the charged particle beam and returning it back to its course.

6. A charged particle beam apparatus using the sample holder according to claim 1,
wherein the sample holding element is fixed to the frame element.

7. The charged particle beam apparatus according to claim 6,
wherein the frame element has slots for observing the sample held by the sample holding element and the magnetic gaps.

8. A charged particle beam apparatus comprising:
an irradiation optical system that irradiates a sample with a charged particle beam;
a magnetic field generating element including three or more magnetic circuits, each having a respective magnetic gap for applying a magnetic field to the sample;
a cantilever-beam-shaped sample holding element that holds the sample on one end thereof; and
a moving mechanism that adjusts a relative position between the sample and the magnetic gaps to selectively position the sample within any one of the magnetic gaps for observation of the sample irradiated in a mode in which the magnetic field of the one gap is applied to the sample in a direction perpendicular to an optical axis of the charged particle beam, and to position the sample outside the magnetic gaps for observation of the sample irradiated in a mode in which no magnetic field is applied to the sample by the magnetic gaps.

9. A charged particle beam apparatus claim 8, further comprising an information processing unit,
wherein the moving mechanism relatively positions the sample and the magnetic field generating element such that the sample is located inside any one of the magnetic gaps, which are three or more in number, and
wherein the information processing unit changes an observation mode based on the relative position.

10. The charged particle beam apparatus according to claim 9,
wherein the information processing unit causes the moving mechanism to relatively position the sample and the magnetic field generating element such that the sample is located outside the magnetic gaps, and changes the observation mode based on a fact that the sample is located outside the magnetic gaps.

11. A charged particle beam apparatus using the sample holder according to claim 8,
wherein two or more of the three or more magnetic circuits are magnetic circuits for deflecting the charged particle beam and returning it back to its course.

12. A charged particle beam apparatus according to claim 8, wherein the moving mechanism can position the magnetic field generating element such that the magnetic gaps are parallel to the optical axis of the charged particle beam.

13. A charged particle beam apparatus using the sample holder according to claim 1, wherein the moving mechanism can position the magnetic field generating element such that the magnetic gaps are parallel to the optical axis of the charged particle beam.

* * * * *